(12) United States Patent
Bae et al.

(10) Patent No.: US 6,716,760 B2
(45) Date of Patent: Apr. 6, 2004

(54) METHOD FOR FORMING A GATE OF A HIGH INTEGRATION SEMICONDUCTOR DEVICE INCLUDING FORMING AN ETCHING PREVENTION OR ETCH STOP LAYER AND ANTI-REFLECTION LAYER

(75) Inventors: Young-hun Bae, Icheon (KR); Won-sung Park, Pyungtaek (KR)

(73) Assignee: Hynix Semiconductor Inc, Gyunggi-do (KR)

( * ) Notice: Subject to any disclaimer, the term of this patent is extended or adjusted under 35 U.S.C. 154(b) by 0 days.

(21) Appl. No.: 09/940,774

(22) Filed: Aug. 27, 2001

(65) Prior Publication Data

US 2002/0093066 A1 Jul. 18, 2002

(30) Foreign Application Priority Data

Aug. 31, 2000 (KR) .................................. 2000-51271

(51) Int. Cl.$^7$ ...................... H01L 21/302; H01L 21/461
(52) U.S. Cl. ...................... 438/706; 438/717; 438/720; 438/722; 438/737
(58) Field of Search ................................ 438/706, 717, 438/720, 722, 737, 724

(56) References Cited

U.S. PATENT DOCUMENTS

| 5,869,901 A | 2/1999 | Kusuyama |
| 6,074,905 A | 6/2000 | Hu et al. |
| 6,187,686 B1 * | 2/2001 | Shin et al. ................. 438/720 |

OTHER PUBLICATIONS

Stanley Wolf Ph.D. and Richard N. Tauber Ph.D. in Silicon Processing for the VLSI Era, vol. 1: Process Technology, Lattice Press, 1986, pp. 539–542, 581–582.*

* cited by examiner

Primary Examiner—W. David Coleman
Assistant Examiner—William M. Brewster
(74) Attorney, Agent, or Firm—Marshall, Gerstein & Borun LLP

(57) ABSTRACT

A method for forming a gate of a high integration semiconductor device in which, when forming a gate electrode on a semiconductor substrate by depositing a nitride layer and an anti-reflection layer after depositing a conductive layer constructed by a gate oxide layer, a polysilicon layer, a tungsten nitride layer and a tungsten layer, an etch prevention layer is formed between the nitride layer and the anti-reflection layer in order to prevent the nitride layer from over-etching, thereby preventing the leakage current, caused by the bridge formed between the gate and the bit line, from generating.

8 Claims, 4 Drawing Sheets

METHOD FOR FORMING A GATE OF A HIGH INTEGRATION SEMICONDUCTOR DEVICE INCLUDING FORMING AN ETCHING PREVENTION OR ETCH STOP LAYER AND ANTI-REFLECTION LAYER

BACKGROUND

1. Technical Field

A high integration semiconductor device is disclosed, and in particular, a method for forming a gate electrode of such a high integration semiconductor device is disclosed in which an etch prevention layer is formed between the nitride layer and the anti-reflection layer in order to prevent the nitride layer from over-etching, thereby preventing generation of a leakage current, caused by a bridge formed between the gate and a bit line.

2. Description of the Background Art

In general, the most widely used gate electrode in semiconductor devices is a doped polycrystalline silicon. As higher integration of semiconductor devices are being developed, metallic layers of titanium and tungsten are also widely used.

While the gate electrode using polycrystalline silicon has the advantage of ensuring stability of the process, its high specific resistance causes reduction of the design rule, thus hindering improvement of the operational speed.

In order to solve this problem, a method has been introduced using, as a gate electrode, a refractory metal such as tungsten with a low specific resistance.

On the other hand, in recent years, a high integration semiconductor device (1 Giga grade) with its gate electrode line width of 0.13 μm has been fabricated and put to practical use. Therefore, as a conductive layer of a gate electrode, a process for using the polysilicon layer and the tungsten layer, as compound, has been introduced.

FIGS. 1a to 1d are views illustrating sequential processes for fabricating a high integration semiconductor device in accordance with the conventional art.

As shown in FIG. 1a, a gate oxide 1a, a poly silicon layer 2, a tungsten nitride layer 3, a tungsten layer 4, a nitride layer 5 and an anti-reflection layer 6 are sequentially deposited on a semiconductor substrate 1.

Thereafter, as shown in FIG. 1b, after depositing a photoresist layer on the resultant material, a photoresist pattern 7 is formed in order to intercept the part to be formed a gate.

Thereafter, as shown in FIG. 1c, after removing the photoresist pattern 7, the anti-reflection layer 6, the nitride layer 5, the tungsten layer 4, the tungsten nitride layer 3 are sequentially etched.

At this time, a gas containing fluorine is commonly used as an etching gas for etching the anti-reflection layer 6, the nitride layer 5, the tungsten layer 4 and the tungsten nitride layer 3.

As shown in FIG. 1d, the polysilicon layer 2 is etched in order to expose the semiconductor substrate 1.

However, as mentioned above, as shown in FIG. 1c, when etching the photoresist pattern 7, the anti-reflection layer 6 and the lower gate layer, the entire thickness loss of the anti-reflection layer 9 and the nitride layer 8 is about 1000 Å as represented with phantom lines and, at this time, the thickness of the tungsten layer 4 and the tungsten nitride layer 3 is about 700 Å.

Accordingly, in the next processes, when etching the self align contact (SAC), there is a disadvantage that since the thickness of the hard mask nitride layer 5 is thin, a bridge between the gate and the bit line is formed, thereby generating a leakage current. Although it is possible to increase the thickness of the hard mask nitride layer 5 in order to solve the above disadvantage, an etching selectivity to the photoresist layer becomes lower when etching the gate because of the increase in the thickness of the hard mask nitride 5, thereby generating a notch and a top loss.

In addition, when etching the tungsten layer 4 and the tungsten nitride layer 3, a difference in the thickness of the nitride layer 3 occurs because of the difference of the etching speed of the etching device.

SUMMARY OF THE DISCLOSURE

Accordingly, a method for forming a gate of a high integration semiconductor device is disclosed wherein when forming a gate electrode on a semiconductor substrate by depositing a nitride layer and an anti-reflection layer after depositing a conductive layer constructed by a gate oxide layer, a polysilicon layer, a tungsten nitride layer and a tungsten layer, an etch prevention layer is formed between the nitride layer and the anti-reflection layer in order to prevent the nitride layer from over-etching, thereby preventing the leakage current, caused by a bridge formed between the gate and the bit line.

In one aspect of the disclosed method, in a gate structure of the high integration semiconductor device constructed with a gate oxide layer, a polysilicon layer, a tungsten layer, a tungsten nitride layer, a nitride layer and an anti-reflection layer, which are sequentially formed on the semiconductor substrate, the gate structure comprises an etching prevention layer for preventing etching of the tungsten layer and the tungsten nitride layer between the anti-reflection layer and the nitride layer.

One disclosed method for forming a gate of a high integration semiconductor device comprises: forming a gate oxide layer, a polysilicon layer, a tungsten nitride layer, a tungsten layer, and a nitride layer on a semiconductor substrate; depositing an etching prevention layer and an anti-reflection layer sequentially on the resultant material; forming a pattern by depositing a photoresist layer on the anti-reflection layer and executing a mask process; etching the nitride layer, the tungsten layer and the tungsten nitride layer sequentially with an etching gas comprising fluorine after performing the above process; and etching the etching prevention layer and the polysilicon layer through an etching gas comprising chlorine after performing the above process.

Preferably, the etching prevention layer has a thickness ranging from about 50 to about 1000 Å.

The etching gas comprises fluorine in the form of any one of $NF_3$, $SF_6$ and $CF_4$ gases.

BRIEF DESCRIPTION OF THE DRAWINGS

The disclosed methods will become better understood with reference to the accompanying drawings, which are given only by way of illustration and thus are not intended to limit of the disclosure, wherein.

DETAILED DESCRIPTION OF THE PRESENTLY PREFERRED EMBODIMENTS

A method for forming a gate of a high integration semiconductor device in accordance with a preferred embodiment of the disclosure will now be described with reference to the accompanying drawings.

FIGS. 2a to 2d are views illustrating sequential processes for forming a gate of a high integration semiconductor device in accordance with the disclosure.

Figure 1A:
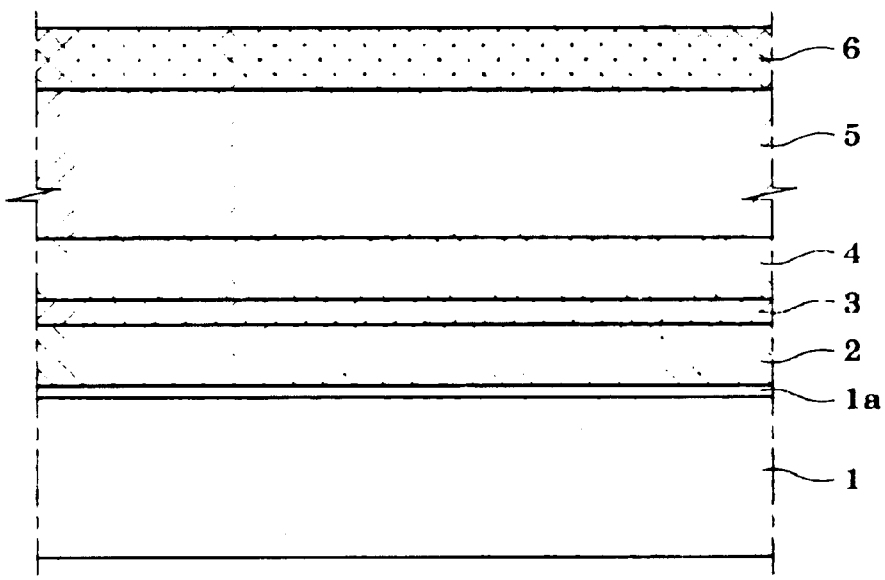
FIGS. 1a to 1d schematically illustrate processes for forming a gate of a high integration semiconductor device in accordance with the conventional art.
Figure 1B:
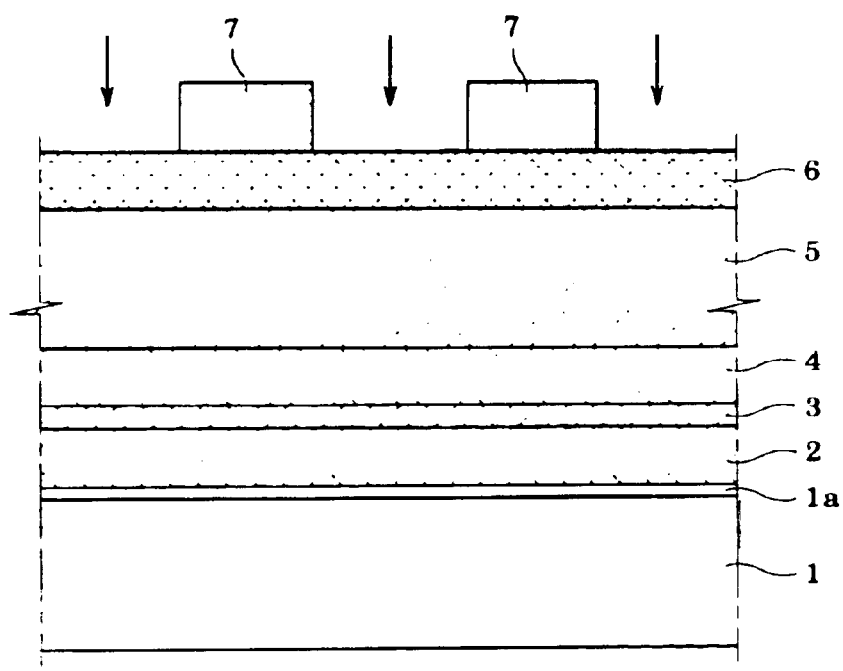
Figure 1C:
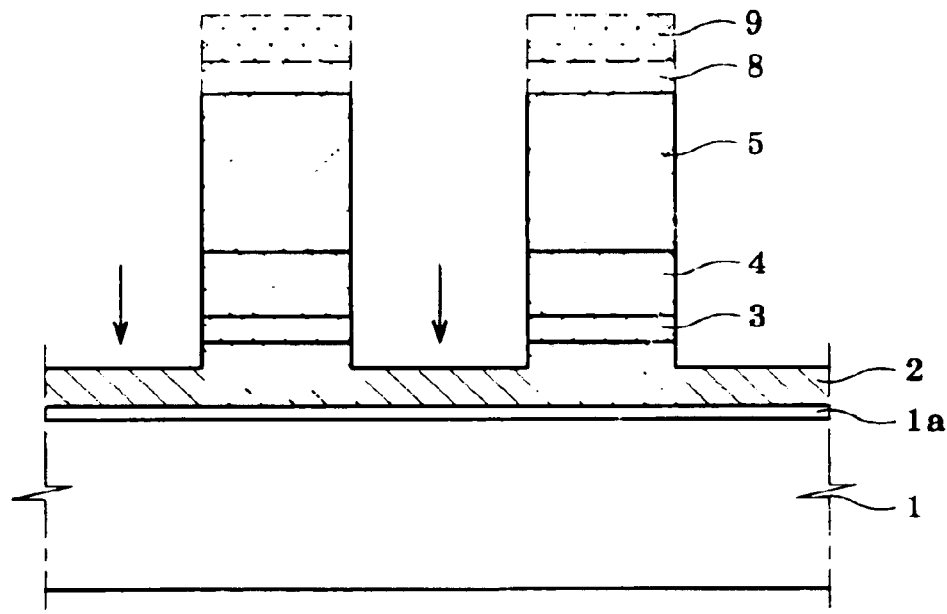
Figure 1D:
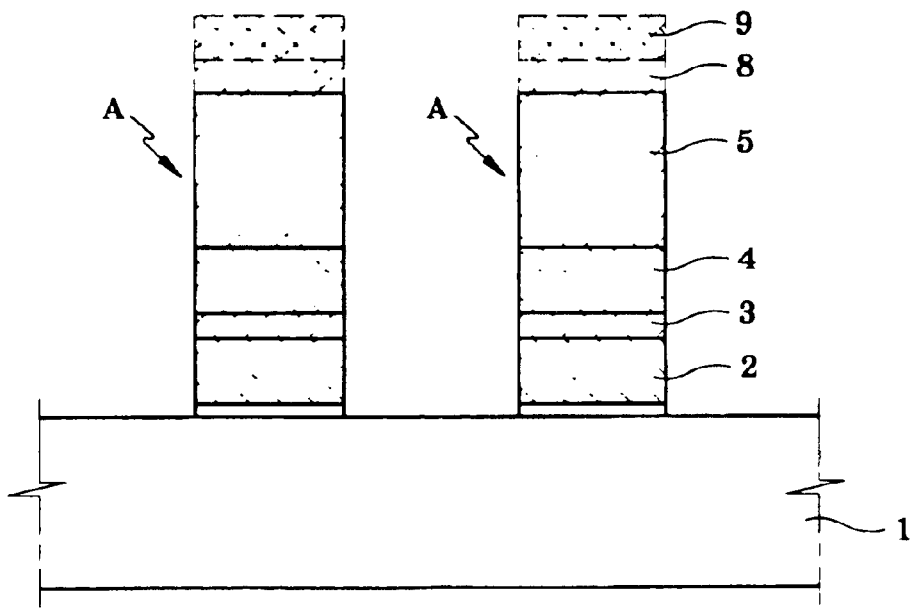
Figure 2A:
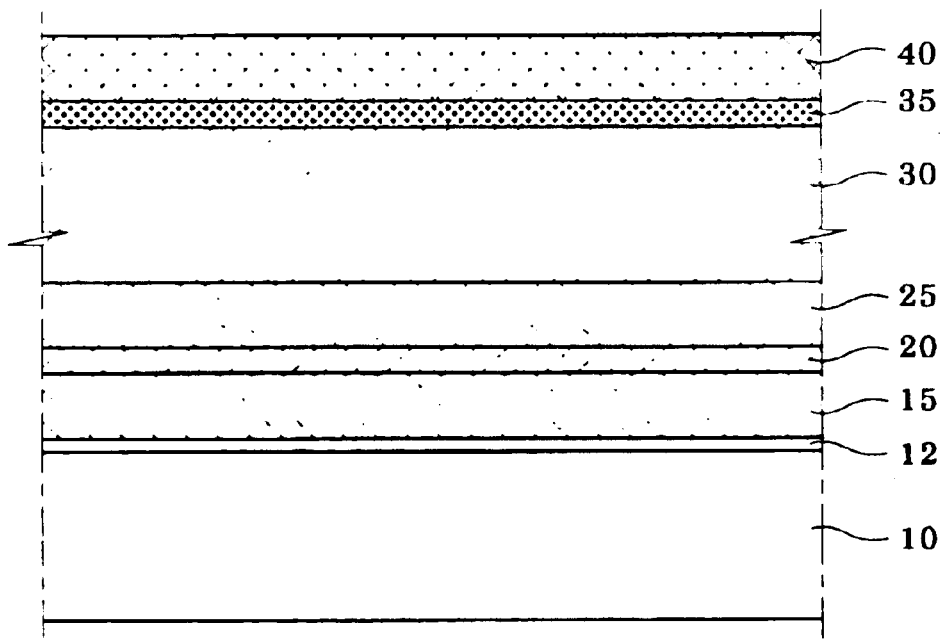
FIGS. 2a to 2d schematically illustrate processes for forming a gate of a high integration semiconductor device in accordance with the present invention.

As shown in FIG. 2a, a gate electrode 12, a polysilicon layer 15, a tungsten nitride layer 20, a tungsten layer 25, a nitride layer 30 are deposited sequentially to a semiconductor substrate 10.

Thereafter, an etching prevention layer 35 and an anti-reflection layer 40 are sequentially deposited on the resultant material. Preferably, the etching prevention layer 35 is deposited in order to have a thickness ranging from about 50 to about 1000 Å.

Preferably, the etching prevention layer 35 is titanium Ti or titanium nitride TiN.

Figure 2B:
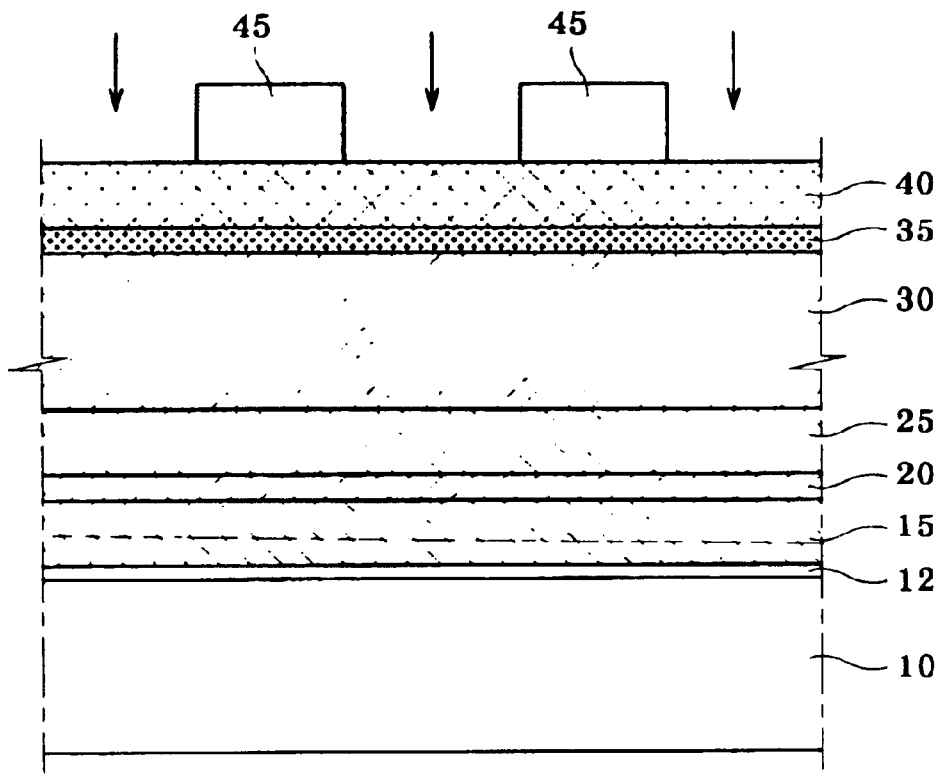

Thereafter, as shown in FIG. 2b, a photoresist pattern is formed on the anti-reflection layer 40 by depositing a photoresist layer 45 and then performing a masking process.

Figure 2C:
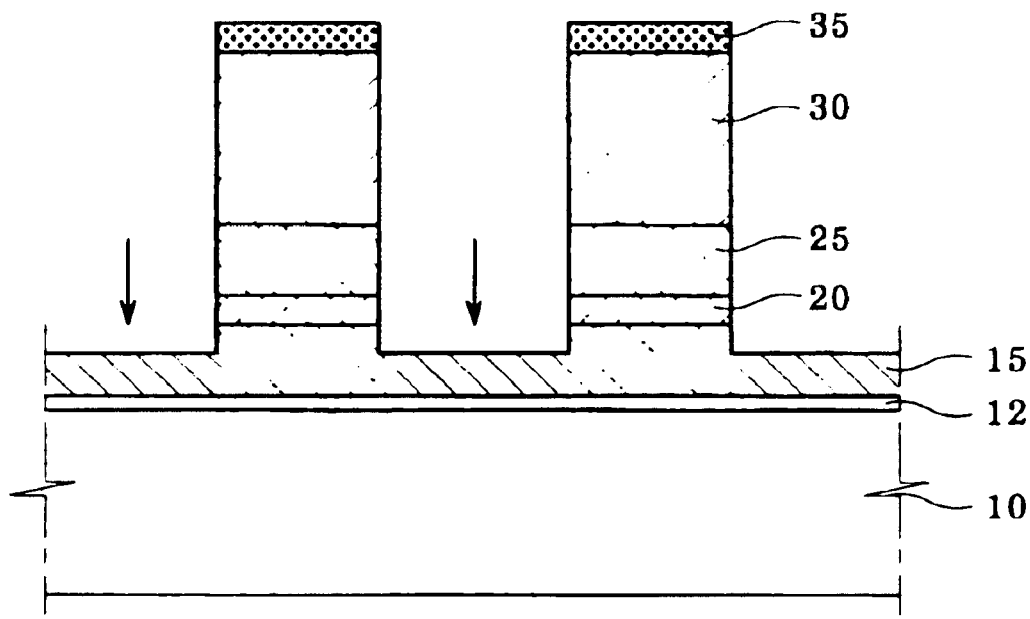

Thereafter, as shown in FIG. 2c, after the above process, the nitride layer 30, the tungsten layer 25 and the tungsten nitride layer 20 are sequentially etched through etching gas comprising fluorine.

At this time, since the etching prevention layer 35 is not etched by the etching gas comprising fluorine, the damage of the lower nitride layer 30 can be prevented.

The etching gas comprising fluorine, preferably, is any one of $NF_3$, $SF_6$ and $CF_4$ gases.

Figure 2D:
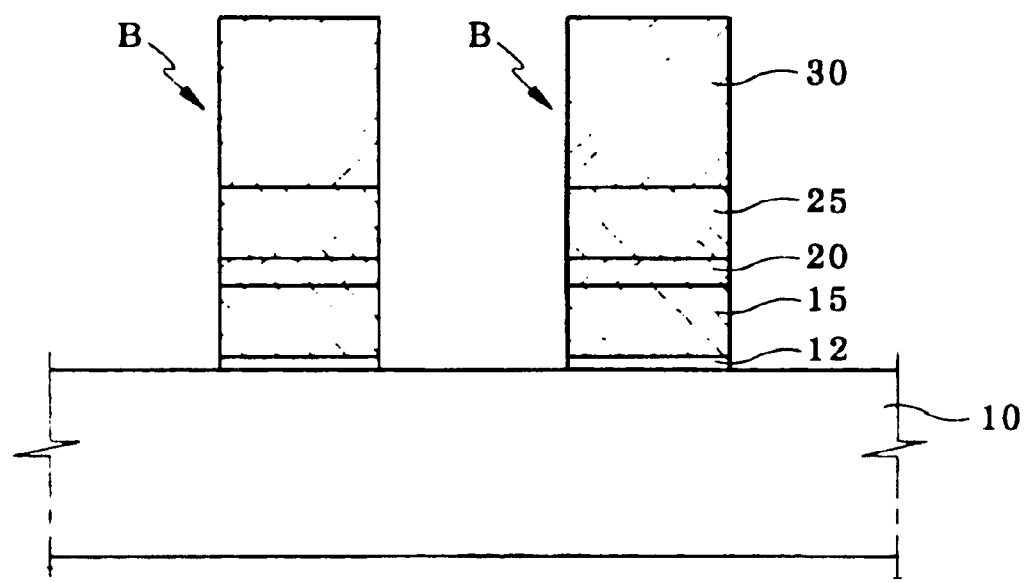

Thereafter, as shown in FIG. 2d, after the above process, the etching prevention layer 35 and the polysilicon layer 15 are etched with the etching gas comprising fluorine.

At this time, the etching gas comprising fluorine is used when etching the polysilicon layer 15 and it has a tendency to not act upon the nitride layer 30, the tungsten layer 25 and the tungsten nitride layer 20 and only acts upon the anti-reflection layer 40.

Accordingly, as mentioned above, the method for forming the gate of the semiconductor device in accordance with the disclosure has several advantages including: when forming a gate on a semiconductor substrate by depositing a conductive layer constructed by the gate oxide layer, the polysilicon layer, the tungsten nitride layer and the tungsten layer and thereafter depositing the nitride layer and the anti-reflection layer, the etch prevention layer is formed between the nitride layer and the anti-reflection layer in order to prevent the nitride layer from over-etching, thereby preventing the leakage current, caused by a bridge formed between the gate and the bit line.

As the disclosed process and devices may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed:

1. A method for forming a gate electrode of high integration semiconductor device comprising the steps of:
   sequentially depositing a gate oxide layer, a polysilicon layer, a tungsten nitride layer, a tungsten layer, and a nitride layer on the semiconductor substrate to form a resultant structure on the semiconductor substrate;
   depositing an etching prevention layer wherein the anti-reflection layer and the etching prevention layer are formed of different materials, on the resultant structure;
   depositing an anti-reflection layer on the etching prevention layer;
   forming a pattern by depositing a photoresist layer on the anti-reflection layer and executing a mask process;
   etching the nitride layer, the tungsten layer and the tungsten nitride layer sequentially with an etching gas comprising fluorine; and
   etching the etching prevention layer and the polysilicon layer with an etching gas comprising chlorine.

2. The method according to claim 1, wherein the etching prevention layer is titanium or titanium nitride.

3. The method for forming a gate according to claim 1, wherein the etching prevention layer has a thickness ranging from about 50 to about 1000 Å.

4. The method for forming a gate according to claim 1, wherein the etching gas comprising fluorine is selected from the group consisting of $NF_3$, $SF_6$ and $CF_4$ gases.

5. A method for forming a gate electrode of a high integration semiconductor device comprising the steps of:
   providing a semiconductor substrate,
   sequentially depositing a gate oxide layer, a polysilicon layer, a tungsten nitride layer, a tungsten layer and a nitride layer on the semiconductor substrate,
   depositing an etching prevention layer wherein the anti-reflection layer and the etching prevention layer are formed of different materials, on the nitride layer,
   depositing an anti-reflection layer on the etching prevention layer;
   forming a pattern by depositing a photoresist layer on the anti-reflection layer using a mask process,
   etching the nitride layer, the tungsten layer and the tungsten nitride layer sequentially with an etching gas comprising fluorine, and
   etching the etching prevention layer and the polysilicon layer with an etching gas comprising chlorine.

6. The method of claim 5, wherein the etching prevention layer is titanium or titanium nitride.

7. The method of claim 5, wherein the etching prevention layer has a thickness ranging from about 50 to about 1000 Å.

8. The method of claim 5, wherein the etching gas comprising fluorine is selected from the group consisting of $NF_3$, $SF_6$ and $CF_4$ gases.

* * * * *

UNITED STATES PATENT AND TRADEMARK OFFICE
CERTIFICATE OF CORRECTION

PATENT NO. : 6,716,760 B2
DATED : April 6, 2004
INVENTOR(S) : Young-Hun Bae et al.

It is certified that error appears in the above-identified patent and that said Letters Patent is hereby corrected as shown below:

<u>Title page, Item [54] and Column 1, line 5,</u>
Title, please delete "AND" and insert -- AND AN --.

<u>Title page,</u>
Item [75], Inventors, please delete "Icheon" and replace with -- Gyunggi-do --; and delete "Pyungtaek" and replace with -- Gyunggi-do --.

<u>Column 4,</u>
Lines 10-12, please delete "depositing an etching prevention layer wherein the anti-reflection layer and the etching prevention layer are formed of different materials, on the resultant structure;" and replace with -- depositing an etching prevention layer on the resultant structure; --.
Lines 13-14, please delete "depositing an anti-reflection layer on the etching prevention layer;" and replace with -- depositing an anti-reflection layer on the etching prevention layer wherein the anti-reflection layer and the etching prevention layer are formed of different materials, --.
Lines 38-40, please delete "depositing an etching prevention layer wherein the anti-reflection layer and the etching prevention layer are formed of different materials, on the nitride layer," and replace with -- depositing an etching prevention layer on the nitride layer, --.
Lines 41-42, please delete "depositing an anti-reflection layer on the etching prevention layer," and replace with -- depositing an anti-reflection layer on the etching prevention layer wherein the anti-reflection layer and the etching prevention layer are formed of different materials, --.

Signed and Sealed this

Twenty-first Day of December, 2004

JON W. DUDAS
*Director of the United States Patent and Trademark Office*